United States Patent [19]
Imai et al.

[11] Patent Number: 5,706,117
[45] Date of Patent: Jan. 6, 1998

[54] DRIVE CIRCUIT FOR ELECTRO-ABSORPTION OPTICAL MODULATOR AND OPTICAL TRANSMITTER INCLUDING THE OPTICAL MODULATOR

[75] Inventors: Keisuke Imai; Setsuo Misaizu; Mitsuharu Noda, all of Oyama; Hiroshi Yamada, Kawasaki, all of Japan

[73] Assignee: Fujitsu Limited, Kanagawa, Japan

[21] Appl. No.: 570,406

[22] Filed: Dec. 11, 1995

[30] Foreign Application Priority Data

May 18, 1995 [JP] Japan ................... 7-120248

[51] Int. Cl.[6] ........................................ H04B 10/04
[52] U.S. Cl. ...................... 359/187; 359/181; 372/38
[58] Field of Search ............................. 359/180–181, 359/184, 187; 372/11–12, 26, 38

[56] References Cited

U.S. PATENT DOCUMENTS

| | | | |
|---|---|---|---|
| 5,394,260 | 2/1995 | Suzuki et al. | 359/180 |
| 5,434,693 | 7/1995 | Tanaka et al. | 359/180 |

FOREIGN PATENT DOCUMENTS

| | | |
|---|---|---|
| 572505 | 3/1993 | Japan. |
| 6164049 | 6/1994 | Japan. |
| 6230328 | 8/1994 | Japan. |

*Primary Examiner*—Kinfe-Michael Negash
*Attorney, Agent, or Firm*—Helfgott & Karas, P C.

[57] ABSTRACT

An optical transmitter including a light source for outputting a carrier light, an electro-absorption optical modulator for absorbing the carrier light according to an applied voltage to thereby output an intensity-modulated signal light, a device for applying an offset voltage to the optical modulator so that the applied voltage enters a region where the generation of the carrier light in the light source is stable, and a device for receiving an input signal to superimpose a modulation signal corresponding to the input signal on the offset voltage. This optical transmitter prevents wavelength chirping of the light source due to residual reflection in the optical modulator to thereby allow improvement in waveform.

13 Claims, 14 Drawing Sheets

FIG. 3
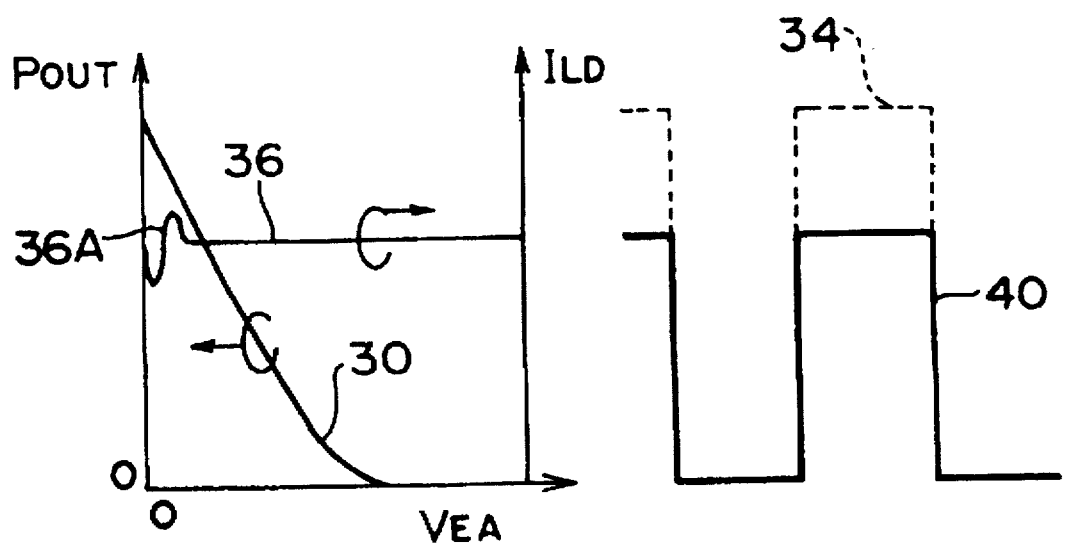
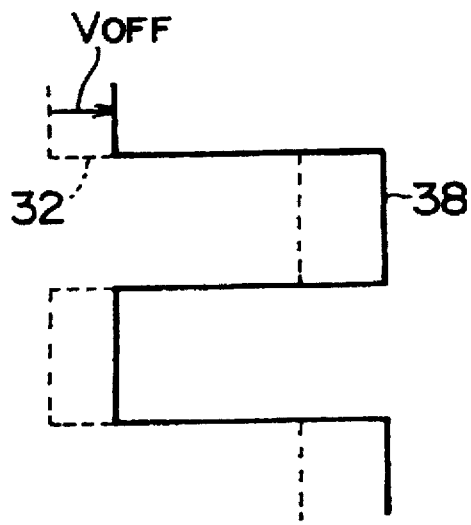

DRIVE CIRCUIT FOR ELECTRO-ABSORPTION OPTICAL MODULATOR AND OPTICAL TRANSMITTER INCLUDING THE OPTICAL MODULATOR

BACKGROUND OF THE INVENTION

1. Field of the Invention

The present invention relates to a drive circuit for an electro-absorption optical modulator and an optical transmitter including the optical modulator.

2. Description of the Related Art

In an optical fiber communication system, a modulation speed is increasing. In direct intensity modulation of a laser diode, there is a problem of wavelength chirping. The chirping causes waveform distortion when a signal light is passed through an optical fiber exhibiting color dispersion (wavelength dispersion). From the viewpoint of fiber loss, the most preferable wavelength for application to a silica fiber is 1.55 μm. At this wavelength, a normal fiber has a color dispersion of about 17 ps/km/nm, which limits a transmission distance. To avoid this problem, the use of an external modulator has increasingly been expected.

As a practical external modulator, a Mach-Zehnder optical modulator (LN modulator) using an LiNbO3 substrate has been developed. A carrier light having a constant intensity from a light source is supplied to the LN modulator, in which an intensity-modulated signal light is obtained by a switching operation using interference of light. However, the LN modulator has defects often pointed out which are the requirement of a relatively high drive voltage, the need for automatic bias control for maintaining a constant operation point, which causes a tendency to increase the size of the device, etc.

In view of these defects, an electro-absorption optical modulator (EA modulator) has been proposed as an external modulator allowed to be driven by low power and fit for a reduction in size. The EA modulator absorbs a carrier light according to an applied voltage to thereby generate an intensity-modulated signal light. A practical EA modulator is provided as a semiconductor chip fabricated by a semiconductor layering technique. This semiconductor chip can be easily integrated with a laser diode as the light source, thereby allowing realization of a greatly small-sized optical transmitter.

In an optical fiber communication system employing an optical transmitter including such an integrated semiconductor chip as an EA modulator and a laser diode, a transmission distance is limited by wavelength chirping due to residual reflection in the semiconductor chip as the EA modulator. That is, in an operational region where the applied voltage to the EA modulator is low, the operation of the laser diode is unstable to cause easy occurrence of waveform deterioration. To solve such a problem, various measures including anti-reflection coating have conventionally been taken for the semiconductor chip. At present, however, such measures are not drastic measures against the waveform deterioration.

SUMMARY OF THE INVENTION

It is therefore an object of the present invention to prevent the waveform deterioration in an optical transmitter including an EA modulator, thereby allowing long-distance transmission.

It is another object of the present invention to provide a drive circuit for an EA modulator fit for prevention of the waveform deterioration.

According to the present invention, there is provided an optical transmitter comprising a light source supplied with a drive current to generate a carrier light having an intensity corresponding to the drive current; an EA modulator for receiving the carrier light and absorbing the carrier light according to an applied voltage to thereby output an intensity-modulated signal light; bias means for applying an offset voltage to the EA modulator so that the applied voltage enters a region where generation of the carrier light in the light source is stable; and modulation signal generating means for receiving an input signal to superimpose a modulation signal corresponding to the input signal on the offset voltage.

In the optical transmitter including the EA modulator for absorbing the carrier light according to the applied voltage to thereby generate the intensity-modulated signal light as mentioned above, the offset voltage is applied to the EA modulator so that the applied voltage to the EA modulator enters the region where the generation of the carrier light in the light source is stable. Accordingly, the waveform deterioration can be prevented to thereby allow long-distance transmission.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 3 is a diagram showing an operation characteristic of the optical transmitter shown in FIG. 2;

DETAILED DESCRIPTION OF THE PREFERRED EMBODIMENTS

Some preferred embodiments of the present invention will now be described in detail with reference to the attached drawings.

Figure 1:
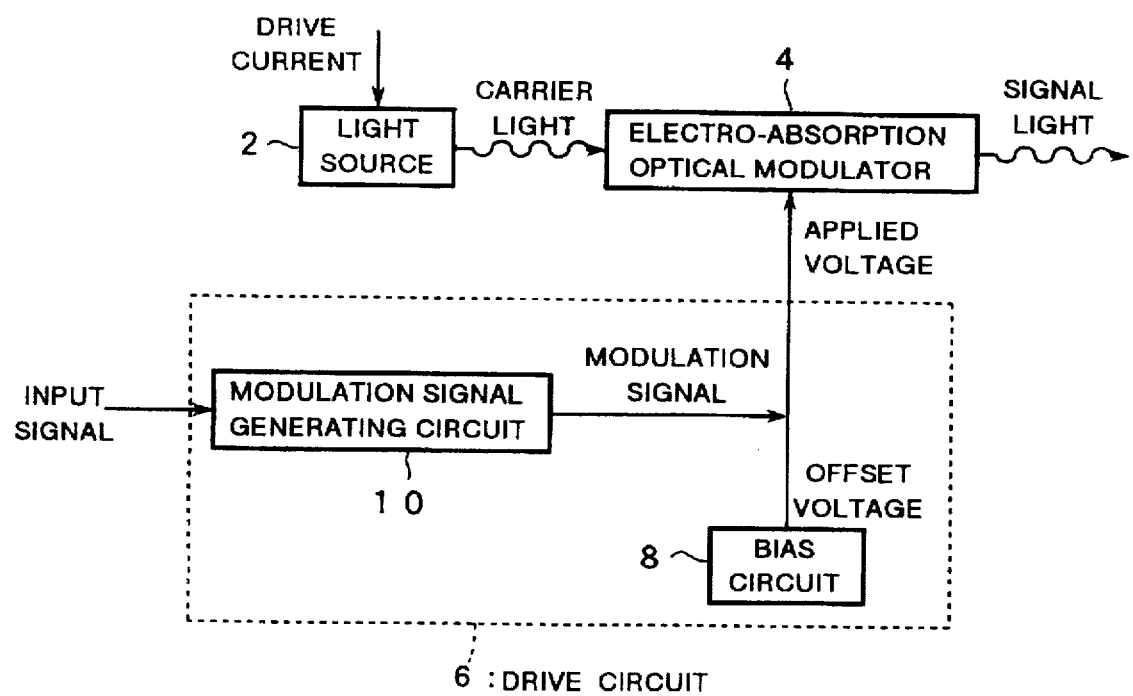
FIG. 1 is a block diagram showing the basic configuration of an optical transmitter according to the present invention.

FIG. 1 is a block diagram showing the basic configuration of an optical transmitter according to the present invention. This optical transmitter has a light source 2 configured from a laser diode, for example, an EA modulator 4 configured from a semiconductor chip, for example, and a drive circuit 6 for supplying an applied voltage to the EA modulator 4. The light source 2 is supplied with a drive current to generate a carrier light having an intensity corresponding to the drive current. The carrier light is input into the EA modulator 4. The EA modulator 4 absorbs the carrier light according to the applied voltage to thereby output an intensity-modulated signal light. The drive circuit 6 includes a bias circuit 8 and a modulation signal generating circuit 10. The bias circuit 8 supplies an offset voltage to the EA modulator 4 so that the applied voltage to the EA modulator 4 enters a region where the generation of the carrier light in the light source 2 is stable. The modulation signal generating circuit 10 receives an input signal and superimposes a modulation signal corresponding to the input signal on the offset voltage.

Figure 2:
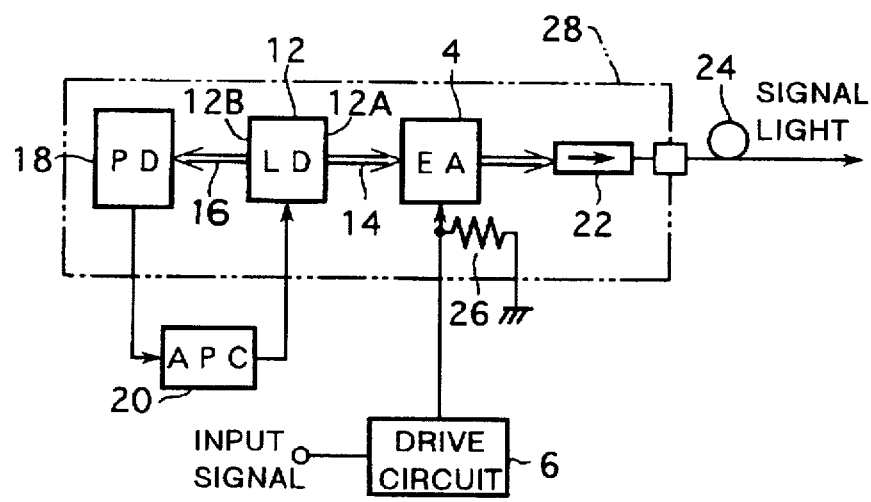
FIG. 2 is a block diagram of an optical transmitter showing a preferred embodiment of the present invention.

FIG. 2 is a block diagram of an optical transmitter showing a preferred embodiment of the present invention. A laser diode 12 used as the light source 2 shown in FIG. 1 has a front surface 12A and a back surface 12B. The carrier light output from the laser diode 12 includes a forward light 14 emitted from the front surface 12A and a backward light 16 emitted from the back surface 12B. The backward light 16 is converted into an electric signal having a level corresponding to the intensity of the backward light 16 in a photodiode (photodetector) 18. An automatic power control circuit (APC circuit) 20 controls the drive current in the laser diode 12 so that the level of the electric signal output from the photodiode 18 becomes constant. The subject of control by the APC circuit 20 may be a temperature of the laser diode 12.

The forward light 14 emitted from the front surface 12A of the laser diode 12 is converted into an intensity-modulated signal light in the EA modulator 4, and this signal light is then fed through an optical isolator 22 to an optical fiber 24. Reference numeral 26 denotes a terminating resistor for generating an applied voltage in the EA modulator 4 according to a signal supplied from the drive circuit 6. The impedance of the terminating resistor for a microwave fit for high-speed modulation is 50Ω, for example. The photodiode 18, the laser diode 12, the EA modulator 4, the optical isolator 22, and the terminating resistor 26 are stored in a package 28. The APC circuit 20 and the drive circuit 6 are provided on a printed wiring board on which the package 28 is mounted.

FIG. 3 is a graph showing an operation characteristic of the optical transmitter shown in FIG. 2. The curve denoted by reference numeral 30 represents the relation between the intensity (power) $P_{OUT}$ of the signal light output from the EA modulator 4 and the applied voltage $V_{EA}$ to the EA modulator 4. It is apparent that a change in the output power $P_{OUT}$ is substantially proportional to the square of a change in the applied voltage $V_{EA}$. In a conventional, general driving method for an EA modulator, a modulation signal changing between a value giving the maximum of the output power $P_{OUT}$ and a value giving the minimum of the output power $P_{OUT}$ as shown by a broken line 32 is supplied to the EA modulator, whereby an intensity-modulated signal light as shown by a broken line 34 is output from the EA modulator.

The curve denoted by reference numeral 36 represents the relation between the drive current $I_{LD}$ in the laser diode 12 and the applied voltage $V_{EA}$ to the EA modulator 4 when the APC circuit 20 shown in FIG. 2 is in operation. In an operational region where the applied voltage $V_{EA}$ is low, the drive current $I_{LD}$ in the laser diode 12 is unstable as shown by reference numeral 36A. The phenomenon that the drive current $I_{LD}$ in the laser diode 12 controlled by the APC circuit 20 changes with a change in the applied voltage $V_{EA}$ to the EA modulator 4 means that the intensity of the carrier light output from the laser diode 12 changes according to the amount of absorption of the carrier light in the EA modulator 4. This is considered to be due to the fact that reflected light on a signal light output end surface of the EA modulator 4 returns to the laser diode 12, and this phenomenon causes chirping in oscillation of the laser diode 12, causing waveform deterioration.

In this preferred embodiment coping with this problem, the EA modulator 4 is operated so as to avoid the region 36A where the generation of the carrier light in the laser diode 12 is unstable. That is, an offset voltage $V_{OFF}$ is preliminarily applied to the EA modulator 4, and a modulation signal as shown by reference numeral 38 is superimposed on the offset voltage $V_{OFF}$, thereby obtaining an intensity-modulated signal light as shown by reference numeral 40. Accordingly, the chirping in the laser diode 12 can be suppressed to thereby minimize the waveform deterioration of the signal light.

There will now be described some preferred embodiments of the drive circuit for applying the offset voltage to the EA modulator as mentioned above. The common features allowing high-speed modulation in first to third preferred embodiments of the drive circuit are as follows:

(1) The bias circuit 8 (see FIG. 1) includes a variable voltage source or a variable current source operatively connected to the EA modulator 4.

(2) The input signal to the modulation signal generating circuit 10 comprises a first signal and a second signal as an inversion signal of the first signal.

(3) The modulation signal generating circuit 10 includes a differential pair of switching elements having first and second ports to which the first and second signals are supplied, respectively, and having an output port operatively connected to the EA modulator 4, and a constant current source operatively connected to the differential pair.

There features will now be described more specifically.

Figure 4:
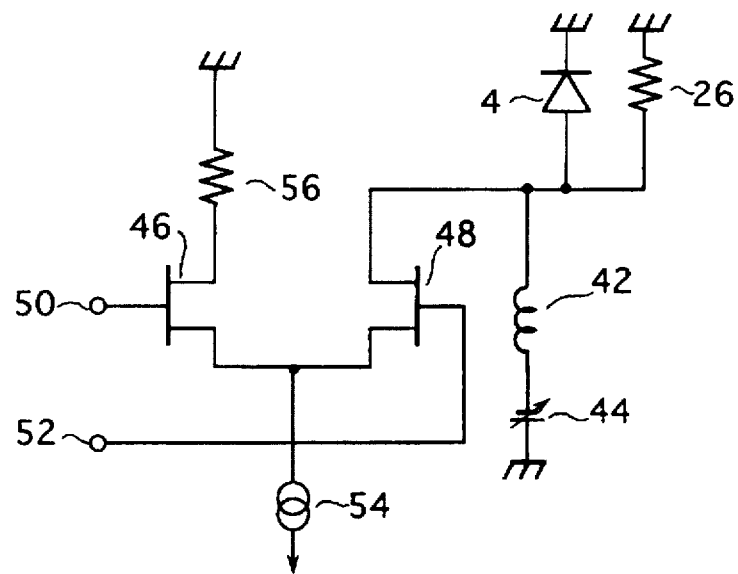
FIG. 4 is a circuit diagram showing a first preferred embodiment of a drive circuit according to the present invention.

FIG. 4 is a circuit diagram showing the first preferred embodiment of the drive circuit. The EA modulator 4 is configured from a semiconductor chip having a diode characteristic, and the terminating resistor 26 is connected between the anode and the cathode of the EA modulator 4. The cathode of the EA modulator 4 is grounded, and the anode of the EA modulator 4 is connected through an inductor 42 to the negative terminal of a variable voltage source 44. The positive terminal of the variable voltage source 44 is grounded.

The differential pair is constituted of FETs (field effect transistors) 46 and 48. The gates of the FETs 46 and 48 are connected to an input terminal 50 for the first signal and an input terminal 52 for the second signal, respectively. The sources of the FETs 46 and 48 are connected to a constant current source 54. The drain of the FET 46 is grounded through a resistor 56, and the drain of the FET 48 is connected to the anode of the EA modulator 4.

According to this circuit, the offset voltage applied to the EA modulator 4 can be regulated by the variable voltage source 44. Further, a modulation signal becoming "high" or "low" according to a level difference between the first input signal supplied to the input terminal 50 and the second input signal supplied to the input terminal 52 can be superimposed as a potential of the drain of the FET 48 on the offset voltage. In this case, the sign of the right-hand side of the $V_{EA}$ axis shown in FIG. 3 is negative.

Figure 5:
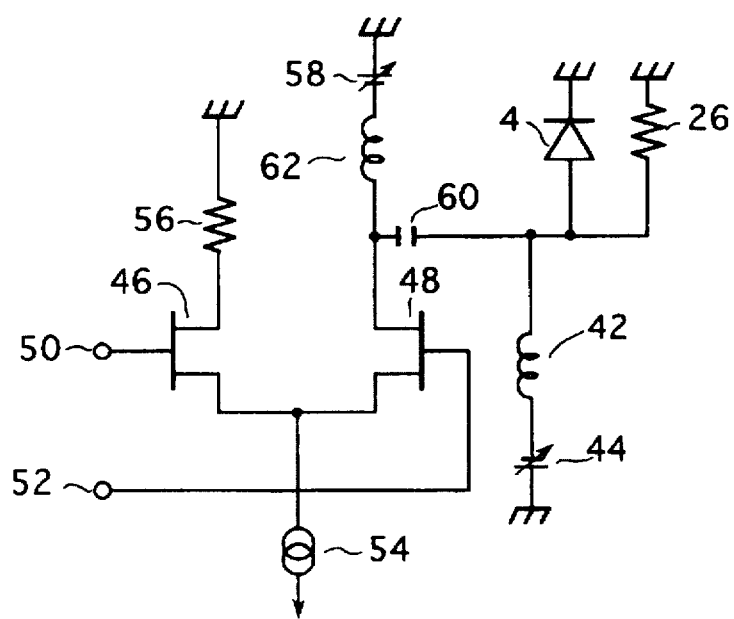
FIG. 5 is a circuit diagram showing a second preferred embodiment of the drive circuit.

FIG. 5 is a circuit diagram showing the second preferred embodiment of the drive circuit. In contrast with the first preferred embodiment shown in FIG. 4, this circuit shown in FIG. 5 is characterized in that a variable voltage source 58 for offsetting an output level of the differential pair (for bias adjustment of the differential pair) is adopted, and accordingly the drain of the FET 48 and the anode of the EA modulator 4 are ac-connected by a capacitor 60. The positive terminal of the variable voltage source 58 is grounded, and the negative terminal of the variable voltage source 58 is connected through an inductor 62 to the drain of the FET 48.

Figure 6:
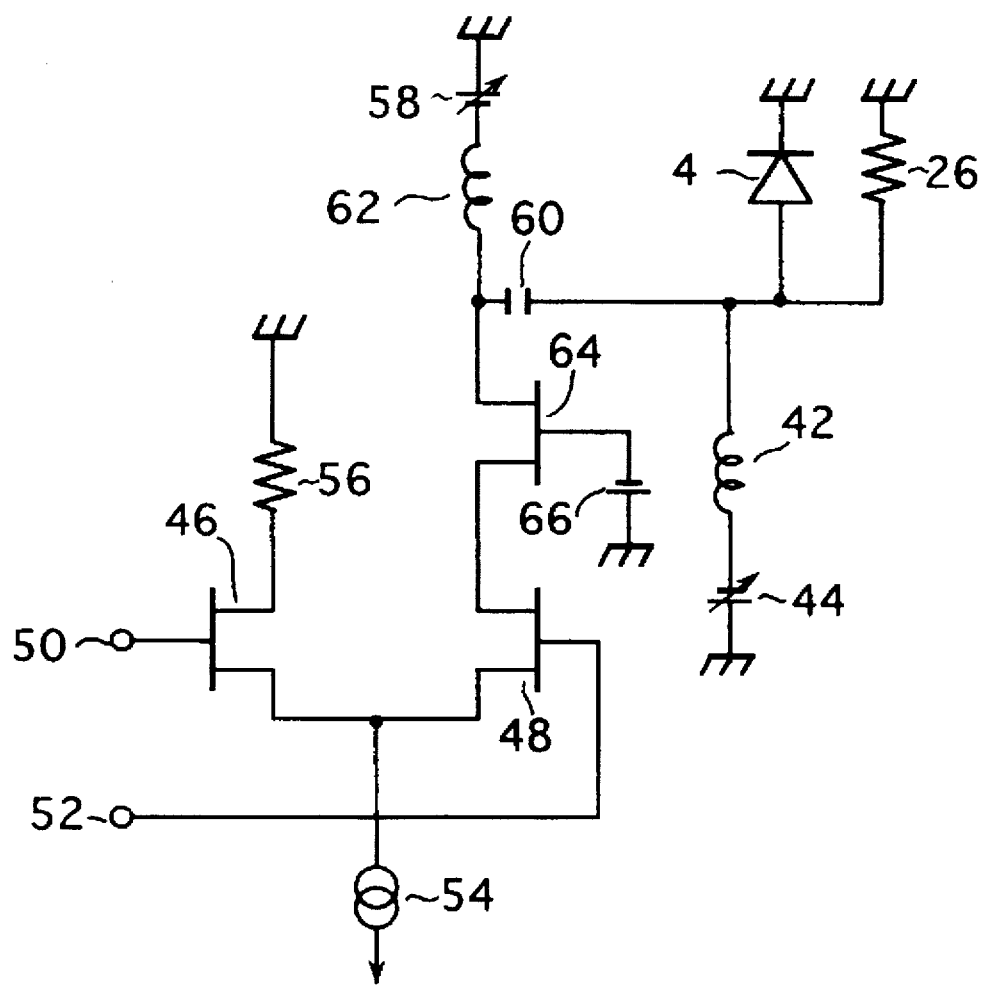
FIG. 6 is a circuit diagram showing a third preferred embodiment of the drive circuit.

FIG. 6 is a circuit diagram showing the third preferred embodiment of the drive circuit. In contrast with the second preferred embodiment shown in FIG. 5, this circuit shown in FIG. 6 is characterized in that a gate grounding circuit including an FET 64 is added. The source of the FET 64 is connected to the drain of the FET 48, and the gate of the FET 64 is connected to the negative terminal of a constant voltage source 66. The positive terminal of the constant voltage source 66 is grounded. A modulation signal obtained as a change in potential of the drain of the FET 64 is superimposed on the offset voltage through the capacitor 60. The addition of such a gate grounding circuit allows a reduction in drain/source voltage of the FETs 46 and 48. In the first to third preferred embodiments, the amplitude of the modulation signal superimposed on the offset voltage can be adjusted according to the magnitude of the current supplied by the constant current source 54, for example.

Figure 7:
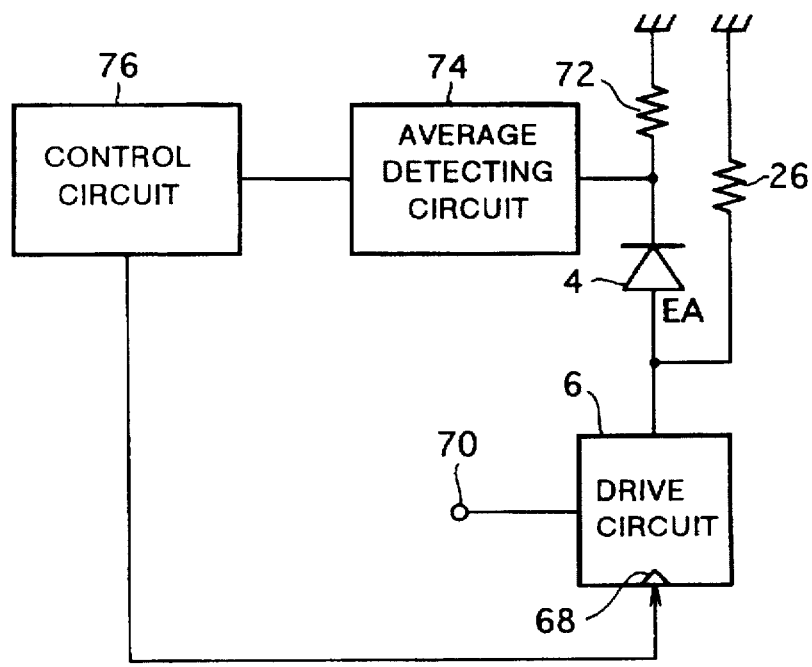
FIG. 7 is a circuit diagram showing a fourth preferred embodiment of the drive circuit.

FIG. 7 is a block diagram showing a fourth preferred embodiment of the drive circuit. In this preferred embodiment, the drive circuit 6 has a control signal input terminal 68 for adjusting the offset voltage applied to the EA modulator 4. Reference numeral 70 denotes an input terminal for the input signal to the drive circuit 6. Further, a resistor 72 for current detection is connected in series with the EA modulator 4 to detect the average of a current generated in the EA modulator 4 by the absorption of the carrier light. To this end, an average detecting circuit 74 is connected to a connection point between the EA modulator 4 and the resistor 72, and an output from the average detecting circuit 74 is supplied to a control circuit 76. The control circuit 76 supplies to the control signal input terminal 68 of the drive circuit 6 a control signal for controlling the offset voltage so that the average detected becomes a constant value.

Figure 8:
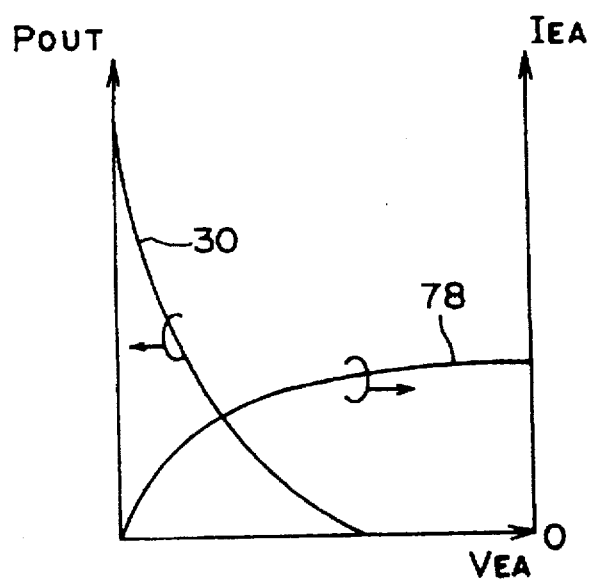
FIG. 8 is a graph showing the relation between a current generated in an EA modulator and an applied voltage to the EA modulator.

FIG. 8 is a graph showing the relation between the current $I_{EA}$ generated in the EA modulator 4 by the absorption of the carrier light and the applied voltage $V_{EA}$. As described with reference to FIG. 3, the output power $P_{OUT}$ of the signal light changes with a change in the applied voltage $V_{EA}$ (see reference numeral 30). The current $I_{EA}$ generated in the EA modulator 4 increases with a decrease in the output power $P_{OUT}$ of the signal light, that is, with an increase in the amount of absorption of the carrier light, as shown by reference numeral 78. This phenomenon means that when a given EA modulator is provided, the current $I_{EA}$ generated in this EA modulator and the applied voltage $V_{EA}$ make a one-to-one correspondence. Accordingly, by detecting the average of this current and controlling the offset voltage so that the average detected becomes a constant value, the offset voltage with an always constant condition can be obtained.

Figure 9:
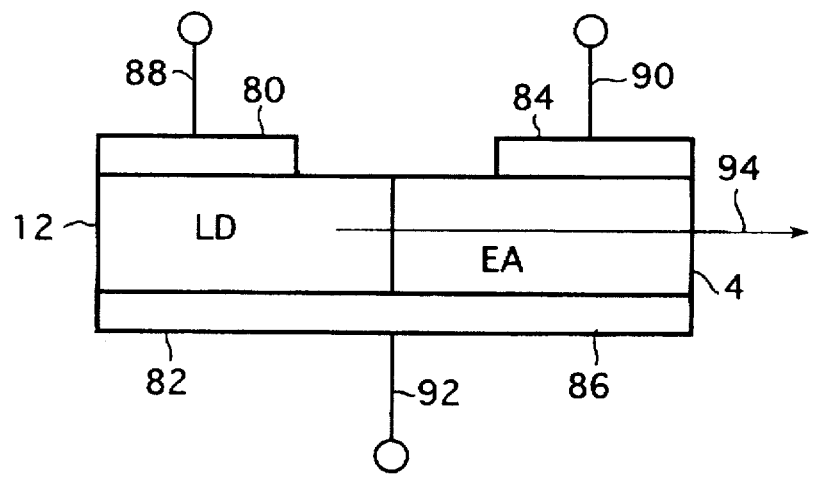
FIG. 9 is a view showing the configuration of an MI-LD (modulator integrated laser diode)

FIG. 9 shows the configuration of a modulator integrated laser diode (MI-LD) applicable to the present invention. This MI-LD is provided as a semiconductor chip having a direct-coupled waveguide structure including a multiple quantum well (MQW) layer of GaInAs, for example. The laser diode 12 has first and second terminals 80 and 82 for supply of a drive current. The EA modulator 4 is configured from a semiconductor chip having third and fourth terminals 84 and 86 for supply of an applied voltage. The laser diode 12 and the EA modulator 4 are monolithically integrated together, and in this case shown, the second and fourth terminals 82 and 86 are also integrated together.

First and second individual leads 88 and 90 are connected to the first and third terminals 80 and 84, respectively, and a common lead 92 is connected to the second and fourth terminals 82 and 86. The arrow denoted by reference numeral 94 shows a direction of travel of the forward light radiated from the laser diode 12 and passed through the EA modulator 4.

Figure 10:
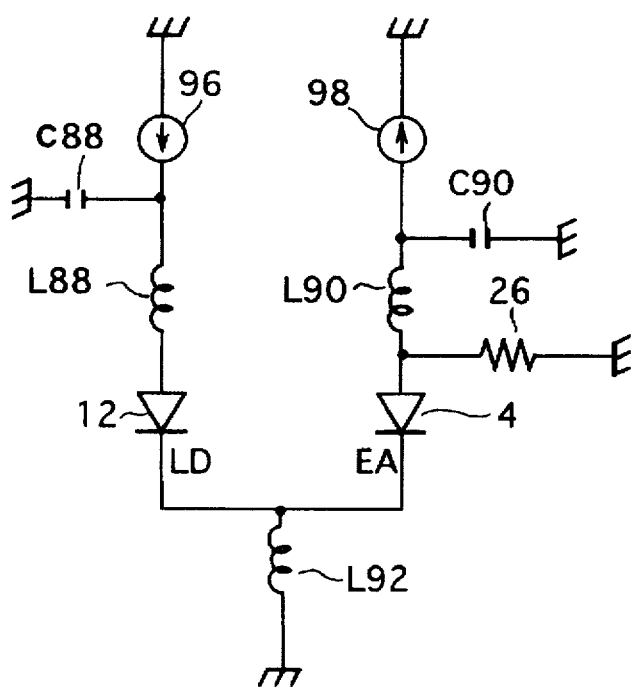
FIG. 10 is an equivalent circuit diagram of the MI-LD shown in FIG. 9.

FIG. 10 is an equivalent circuit diagram of the MI-LD shown in FIG. 9. Reference characters L88, L90, and L92 denote the inductances of the individual leads 88 and 90 and the common lead 92, respectively. Reference characters C88 and C90 denote the parasitic capacitances of the individual leads 88 and 90, respectively. In the equivalent circuit shown, the cathodes of the laser diode 12 and the EA modulator 4 are grounded through the common lead 92. The anode of the laser diode 12 is connected through the individual lead 88 to a drive current source 96, and the anode of the EA modulator 4 is connected through the individual lead 90 to a modulation signal source 98. The drive current source 96 functions to supply a constant or APC controlled DC drive current to the laser diode 12. The modulation signal source 98 functions to supply a high-speed modulation signal to the EA modulator 4.

In the MI-LD as shown in FIG. 10, the inductance L92 by the common lead 92 is provided between each cathode of the laser diode 12 and the EA modulator 4 and the ground. As a result, a high-frequency modulation signal to be supplied to only the EA modulator 4 leaks into the laser diode 12, causing minute modulation of the laser diode 12 by this leak signal. As the result of this minute modulation, the spectrum of the carrier light emitted from the laser diode 12 is spread to cause waveform distortion of the signal light output from the EA modulator 4, thus rendering long-distance transmission difficult. Another important problem due to the leakage of the high-frequency signal into the laser diode 12 is that the high-speed signal having leaded into the laser diode 12 affects the individual lead 88 of the laser diode 12. That is, the leak signal causes resonance in the inductance L88 and the capacitance C88 of the individual lead 88, resulting in waveform deterioration of the signal light. To cope with these problems, there are provided some improvements of the MI-LD as shown in FIGS. 11 and 12.

Figure 11:
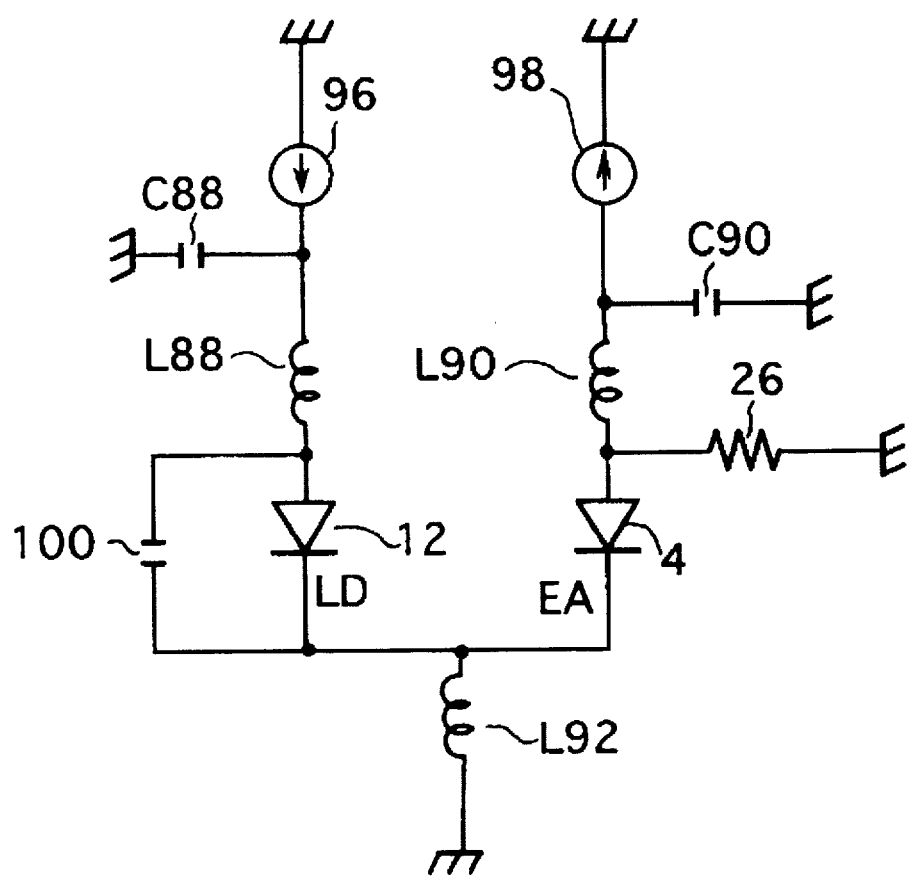
FIG. 11 is an equivalent circuit diagram showing a first preferred embodiment of an improved MI-LD according to the present invention.

FIG. 11 is an equivalent circuit diagram showing a first preferred embodiment of the improved MI-LD. This MI-LD is characterized in that a capacitor 100 is connected in parallel to the laser diode 12. According to this configuration, the high-frequency signal having leaked toward the laser diode 12 can be bypassed by the capacitor 100, thereby suppressing the spreading of the spectrum of the carrier light emitted from the laser diode 12 and accordingly improving the waveform of the signal light output from the EA modulator 4.

Figure 12:
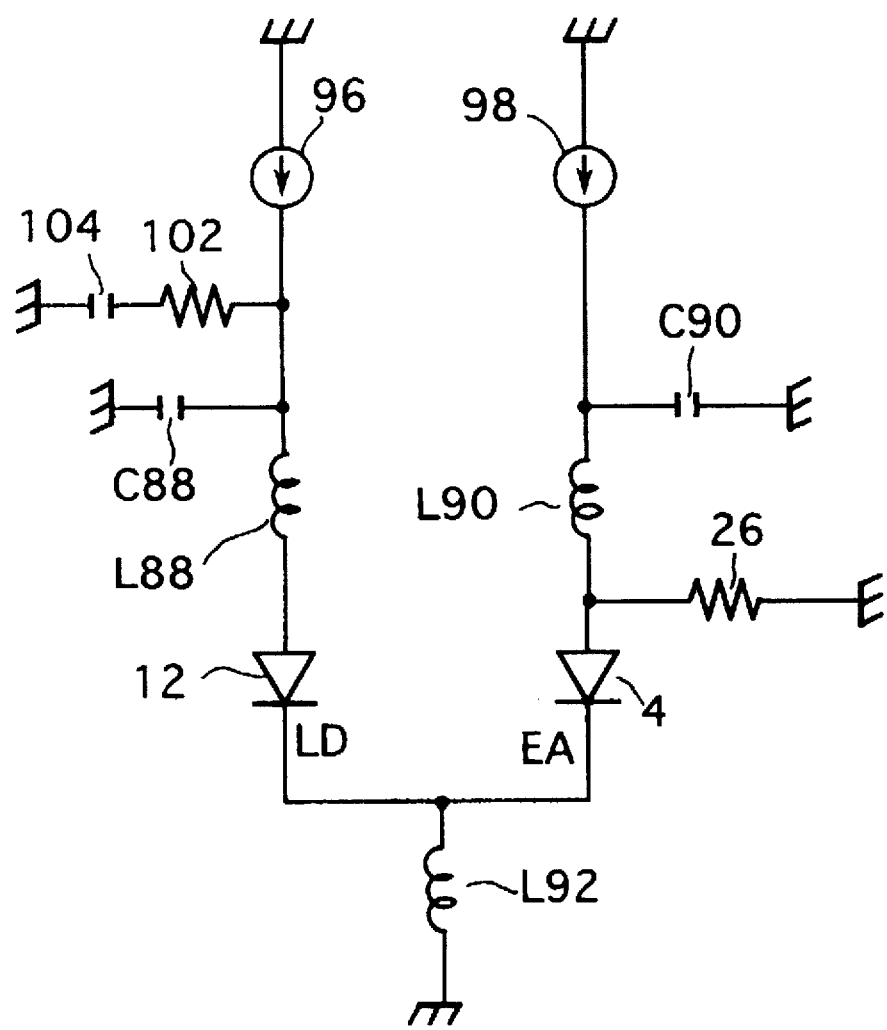
FIG. 12 is an equivalent circuit diagram showing a second preferred embodiment of the improved MI-LD.

FIG. 12 is an equivalent circuit diagram showing a second preferred embodiment of the improved MI-LD. This MI-LD is characterized in that a resistor 102 and a capacitor 104 connected in series are provided between the individual lead 88 of the laser diode 12 and the ground. The resistor 102 and the capacitor 104 are connected between the ground and an LD bias current input terminal (not shown) provided in the package 28 shown in FIG. 2, for example. The use of the resistor 102 and the capacitor 104 allows the resonance frequency of a resonance circuit including the individual lead 88 of the laser diode 12 to be shifted to a region where the influence of the signal component is avoided, e.g., shifted to a low-frequency region. In addition, a Q-value of resonance can be reduced. Accordingly, the waveform of the signal light can be improved.

Thus, according to the present invention, there is provided an optical transmitter having such an MI-LD as shown in FIG. 11 or 12 for the purpose of improving the waveform of the signal light.

That is, in accordance with an aspect of the present invention, there is provided an optical transmitter comprising a laser diode having first and second terminals for supply of a drive current, for generating a carrier light having an intensity corresponding to the drive current; an electro-absorption optical modulator comprising a semiconductor chip monolithically integrated with the laser diode and having third and fourth terminals, for absorbing the carrier light according to an applied voltage supplied between the third and fourth terminals to thereby output an intensity-modulated signal light; first and second individual leads connected to the first and third terminals, respectively; a common lead connected to the second and fourth terminals; and a capacitor connected between the first and second terminals.

Further, in accordance with another aspect of the present invention, there is provided an optical transmitter comprising a laser diode having first and second terminals for supply of a drive current, for generating a carrier light having an intensity corresponding to the drive current; an electro-absorption optical modulator comprising a semiconductor chip monolithically integrated with the laser diode and having third and fourth terminals, for absorbing the carrier light according to an applied voltage supplied between the third and fourth terminals to thereby output an intensity-modulated signal light; first and second individual leads connected to the first and third terminals, respectively; a common lead for connecting the second and fourth terminals to a ground; and a resistor and a capacitor connected in series and provided between the first individual lead and the ground.

Figure 13:
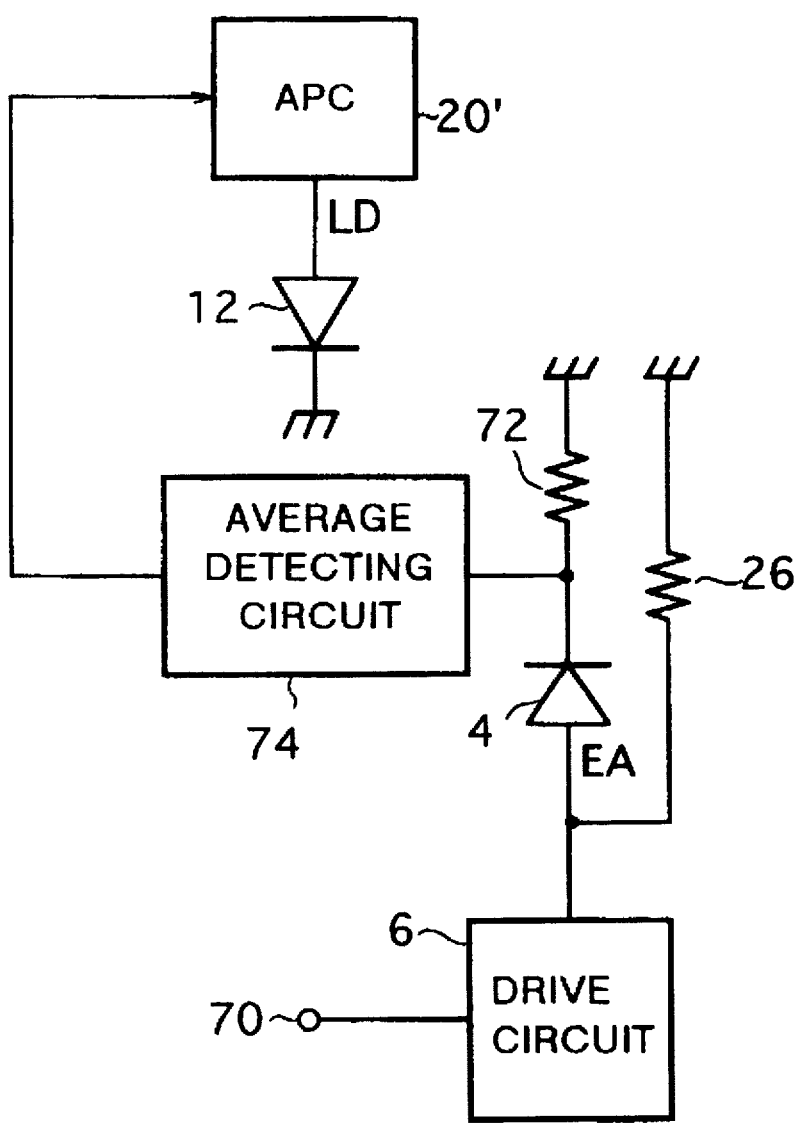
FIG. 13 is a block diagram of an optical transmitter characterized in APC according to the present invention.

FIG. 13 is a block diagram of an optical transmitter characterized in APC for the laser diode 12 as a carrier light source. In the preferred embodiment shown in FIG. 2, the photodiode 18 for receiving the backward light from the laser diode 12 is used to perform the APC for the laser diode 12 with the backward light. In contrast therewith, according to this preferred embodiment shown in FIG. 13, the photodiode for receiving the backward light is omitted. That is, the average of a current generated in the EA modulator 4 is detected, and a drive current in the laser diode 12 is controlled so that the average detected above becomes a constant value. The configuration of this preferred embodiment will now be described more specifically.

It may be considered from the graph shown in FIG. 8 that the intensity of a carrier light emitted from the laser diode 12 in the optical transmitter shown in FIG. 13 is reflected on the average of a current generated in the EA modulator 4 by the absorption of the carrier light. Accordingly, the optical transmitter in this preferred embodiment adopts the resistor 72 for current detection and the average detecting circuit 74 shown in FIG. 7. An output signal from the average detecting circuit 74 is supplied to an APC circuit 20'. The APC circuit 20' controls a drive current in the laser diode 12 so that the current average detected in the average detecting circuit 74 becomes a constant value. The APC characterized in the preferred embodiment shown in FIG. 13 can be adopted not only when an offset voltage is applied to the EA modulator 4, but also when no offset voltage is applied to the EA modulator 4.

As previously described in connection with the operation characteristic shown in FIG. 3, a change in power $P_{OUT}$ of the signal light output from the EA modulator is proportional to the square of a change in applied voltage $V_{EA}$ to the EA modulator. In the case where the input signal is a digital signal, the duty of the input signals (the first and second input signals) supplied to the ports 50 and 52 in the preferred embodiment shown in FIG. 4, for example, is equal to the duty of the modulation signal supplied from the drain of the FET 48 to the anode of the EA modulator 4. However, the duty of the modulation signal becomes different from the duty of the signal light output from the EA modulator 4.

Figure 14:
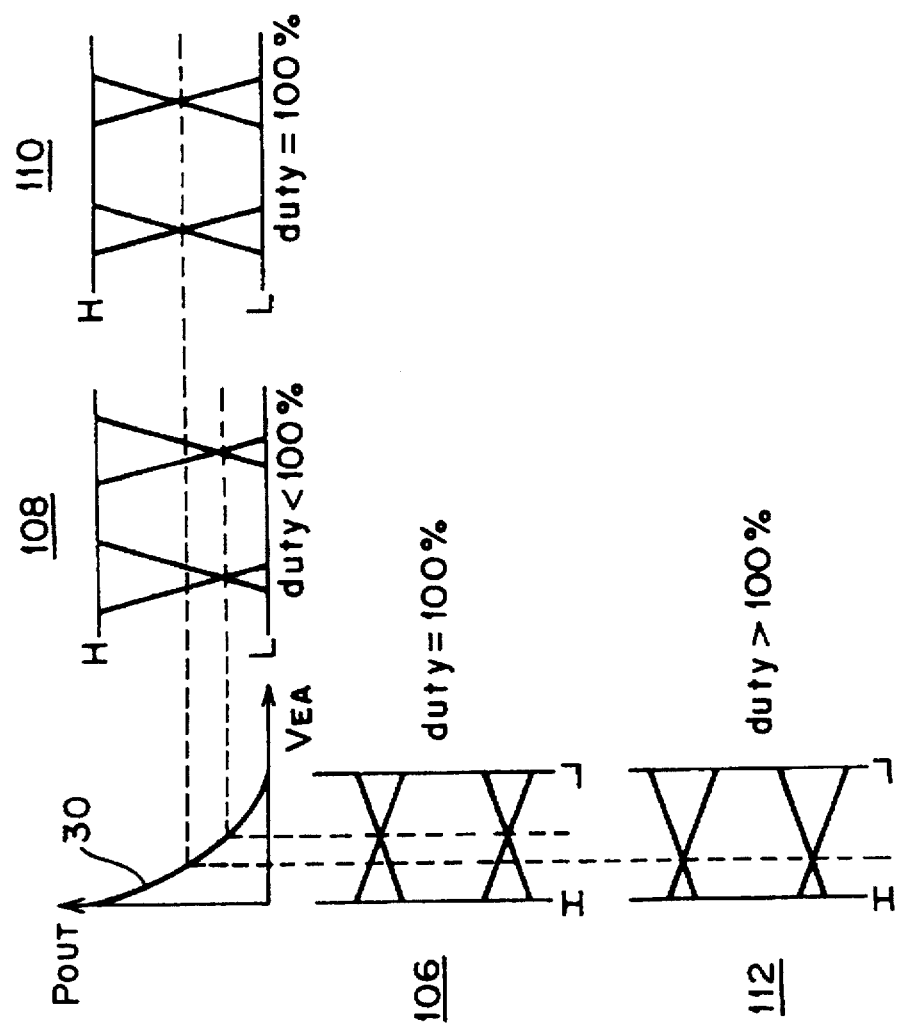
FIG. 14 is a diagram for illustrating changes in duty of an input signal and a signal light.

FIG. 14 is a diagram for specifically illustrating such a change in the duty. Reference numeral 30 denotes a characteristic curve showing the relation between the output power $P_{OUT}$ of the signal light and the applied voltage $V_{EA}$ as similar to that shown in FIG. 3. For simplicity of description, it is assumed that the variable voltage source 44 shown in FIG. 4 is neglected and no offset voltage is accordingly applied to the EA modulator 4. When the duty of the modulation signal is 100% as shown by reference numeral 106, the duty in the output waveform of the signal light becomes less than 100% as shown by reference numeral 108 because of the fact that the characteristic curve 30 is a parabola.

In the above description, the duty equal to 100% means that the cross point between a rising line and a falling line in a digital signal is coincident with the midpoint between a high level and a low level. Further, the duty less than 100% means that the cross point is shifted toward the low level, whereas the duty greater than 100% means that the cross point is shifted toward the high level. In the case where the system is designed to obtain the duty of 100%, the change in the duty in the output waveform of the signal light causes a deterioration in receiving sensitivity. To make the duty in the output waveform of the signal light equal to 100% as shown by reference numeral 110, it is desired to preliminarily set the duty of the modulation signal to be greater than 100% as shown by reference numeral 112.

There will now be described some preferred embodiments of the drive circuit which can preliminarily set the duty of the modulation signal to an arbitrary value, so as to make the duty in the output waveform of the signal light equal to a desired value (e.g., 100%).

Figure 15:
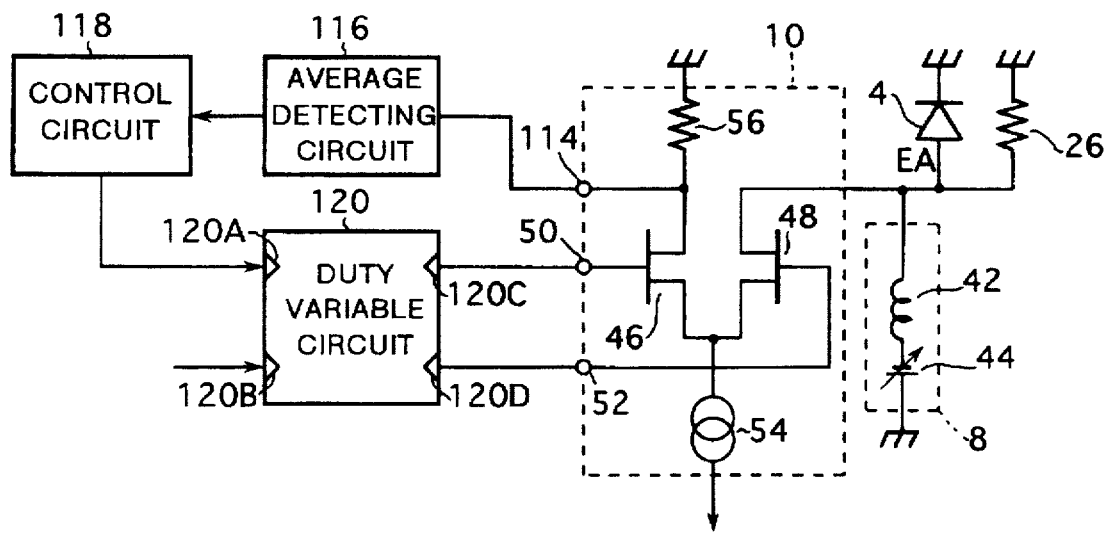
FIG. 15 is a block diagram showing a fifth preferred embodiment of the drive circuit.

FIG. 15 is a block diagram showing a fifth preferred embodiment of the drive circuit to which the present invention is applied. One of the features in this preferred embodiment is that the modulation signal generating circuit 10 has a port 114 for outputting an inversion signal of the modulation signal supplied from the drain of the FET 48 to the anode of the EA modulator 4. This inversion signal is taken out as a change in potential of the drain of the FET 46. The drive circuit in this preferred embodiment also includes an average detecting circuit 116, a control circuit 118, and a duty variable circuit 120 in addition to the bias circuit 8 and the modulation signal generating circuit 10.

The duty variable circuit 120 has a port 120A for inputting a reference signal, a port 120B for inputting a digital input signal, and ports 120C and 120D for outputting signals appropriately converted in duty. In this preferred embodiment, the signals output from the ports 120C and 120D are inversion signals so that they match the differential pair (FETs 46 and 48) in the modulation signal generating circuit 10. The duty variable circuit 120 generates a duty-converted input signal obtained by changing the duty of the input signal according to the level of the reference signal supplied to the port 120A. The average detecting circuit 116 detects the average of the inversion signal output from the port 114, and supplies the average detected to the control circuit 118. The control circuit 118 controls the reference signal to be supplied to the port 120A in the duty variable circuit 120 so that the average detected in the average detecting circuit 116 becomes a constant value.

With this configuration, the duty of the modulation signal supplied from the drain of the FET 48 to the anode of the EA modulator 4 and the duty of the inversion signal of this modulation signal make a one-to-one correspondence, so that the duty of the modulation signal can be maintained at a desired constant value. Furthermore, the duty of the modulation signal can be set to an arbitrary value by suitably setting the level of the reference signal to be supplied to the duty variable circuit 120, so that the duty of the signal light output from the EA modulator 4 can be stabilized at 100%, for example. In other words, the target of the average detected by the average detecting circuit 116 is set so that the duty of the signal light output from the EA modulator 4 comes into coincidence with the duty of the digital input signal supplied to the duty variable circuit 120.

The idea in this preferred embodiment to prevent the waveform deterioration due to the difference between the duty of the input signal and the duty of the signal light may be applied also to the case where no offset voltage is applied to the EA modulator.

Thus, in accordance with another aspect of the present invention, there is provided a drive circuit for an electro-absorption optical modulator for receiving a carrier light from a light source and absorbing the carrier light according to an applied voltage to thereby output an intensity-modulated signal light, comprising means having first and second input ports supplied with a digital input signal and a reference signal, respectively, for generating a duty-converted input signal obtained by changing a duty of the digital input signal according to the reference signal; modulation signal generating means for generating a modulation signal according to the duty-converted input signal, applying the modulation signal as a change in the applied voltage to the optical modulator, and outputting an inversion signal of the modulation signal; average detecting means for receiving the inversion signal, detecting an average of the inversion signal, and outputting the average detected; and means operatively connected to the average detecting means and the second input port, for controlling the reference signal so that the average detected becomes a constant value.

Figure 16:
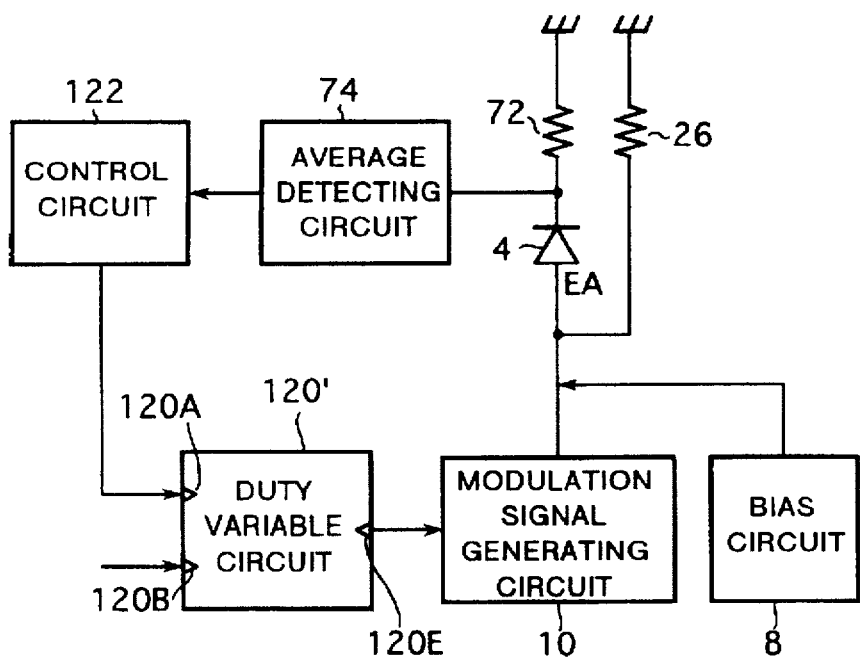
FIG. 16 is a block diagram showing a sixth preferred embodiment of the drive circuit.

FIG. 16 is a block diagram showing a sixth preferred embodiment of the drive circuit to which the present invention is applied. The average detecting circuit 74 detects the average of a current generated in the EA modulator 4 by the absorption of a carrier light. A duty variable circuit 120' is provided to generate a duty-converted input signal obtained by changing the duty of a digital input signal input into a port 120B according to a reference signal input into a port 120A, and supply the duty-converted input signal from a port 120E to the modulation signal generating circuit 10. A control circuit 122 is provided to control the reference signal to be supplied to the port 120A of the duty variable circuit 120' so that the average detected in the average detecting circuit 74 becomes a constant target value. Preferably, this target value is set so that the duty of the signal light output from the EA modulator 4 comes into coincidence with the duty of the digital input signal supplied to the port 120B of the duty variable circuit 120'.

Figure 17:
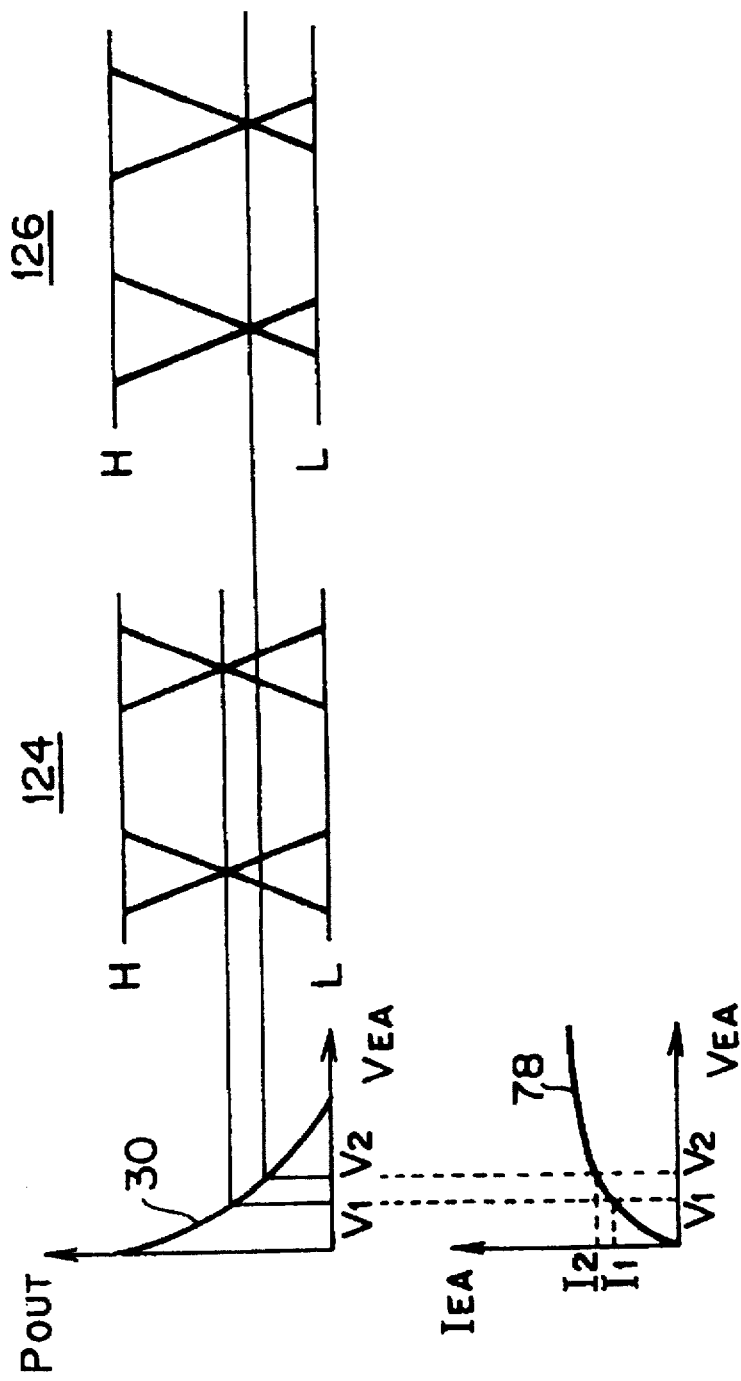
FIG. 17 is a diagram for illustrating the operation principle in FIG. 16.

FIG. 17 is a diagram for illustrating the operation principle of the drive circuit shown in FIG. 16. The curve denoted by reference numeral 30 shows the relation between the output power $P_{OUT}$ of the signal light in the EA modulator 4 and the applied voltage $V_{EA}$, and the curve denoted by reference numeral 78 shows the relation between the current $I_{EA}$ flowing in the EA modulator 4 and the applied voltage $V_{EA}$ (see FIG. 8). In the case where the duty of the signal light is 100% as shown by reference numeral 124, the applied voltage $V_{EA}$ is V1 according to the average power of the signal light and the characteristic curve 30, and the current $I_{EA}$ flowing in the EA modulator 4 at this time is $I_1$ according to the characteristic curve 78. When the duty of the signal light is reduced as shown by reference numeral 126, the applied voltage $V_{EA}$ and the current $I_{EA}$ accordingly change to $V_2$ and $I_2$, respectively. Accordingly, to obtain a constant value, e.g., 100%, for the duty of the signal light, control is performed so that the current average detected in the average detecting circuit 74 (see FIG. 16) becomes $I_1$.

While an offset voltage is applied from the bias circuit 8 to the EA modulator 4 in the preferred embodiment shown in FIG. 16, the control according to the principle of FIG. 17 may be applied also to the case where no offset voltage is applied to the EA modulator.

Thus, in accordance with another aspect of the present invention, there is provided a drive circuit for an electro-absorption optical modulator for receiving a carrier light from a light source and absorbing the carrier light according to an applied voltage to thereby output an intensity-modulated signal light, comprising means having first and second input ports supplied with a digital input signal and a reference signal, respectively, for generating a duty-converted input signal obtained by changing a duty of the digital input signal according to the reference signal; modulation signal generating means for generating a modulation signal according to the duty-converted input signal and applying the modulation signal as a change in the applied voltage to the optical modulator; average detecting means for detecting an average of a current generated in the optical modulator by absorption of the carrier light; and means operatively connected to the average detecting means and the second input port, for controlling the reference signal so that the average becomes a constant value.

Figure 18:
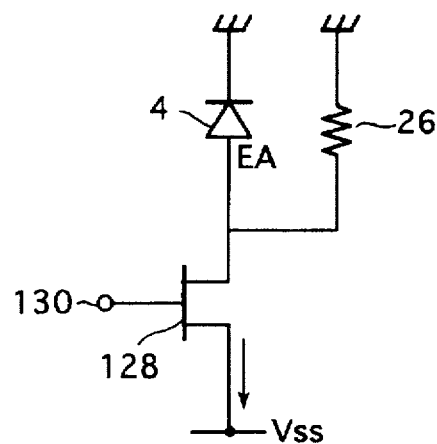
FIG. 18 is a diagram showing a modulation signal generating circuit using an operation characteristic of an FET.

FIG. 18 is a diagram showing a modulation signal generating circuit using the operation characteristic of an FET (field effect transistor). In this preferred embodiment, the duty of the signal light can be made coincident with the duty of the input signal without the use of a duty variable circuit. The modulation signal generating circuit in this preferred embodiment includes a source grounding circuit having an FET 128. The gate of the FET 128 is connected to a port 130 for inputting a digital input signal, and the drain of the FET 128 is connected to a connection point between the EA modulator 4 and the terminating resistor 26. The source of the FET 128 is connected to a power supply line Vss.

Figure 19:
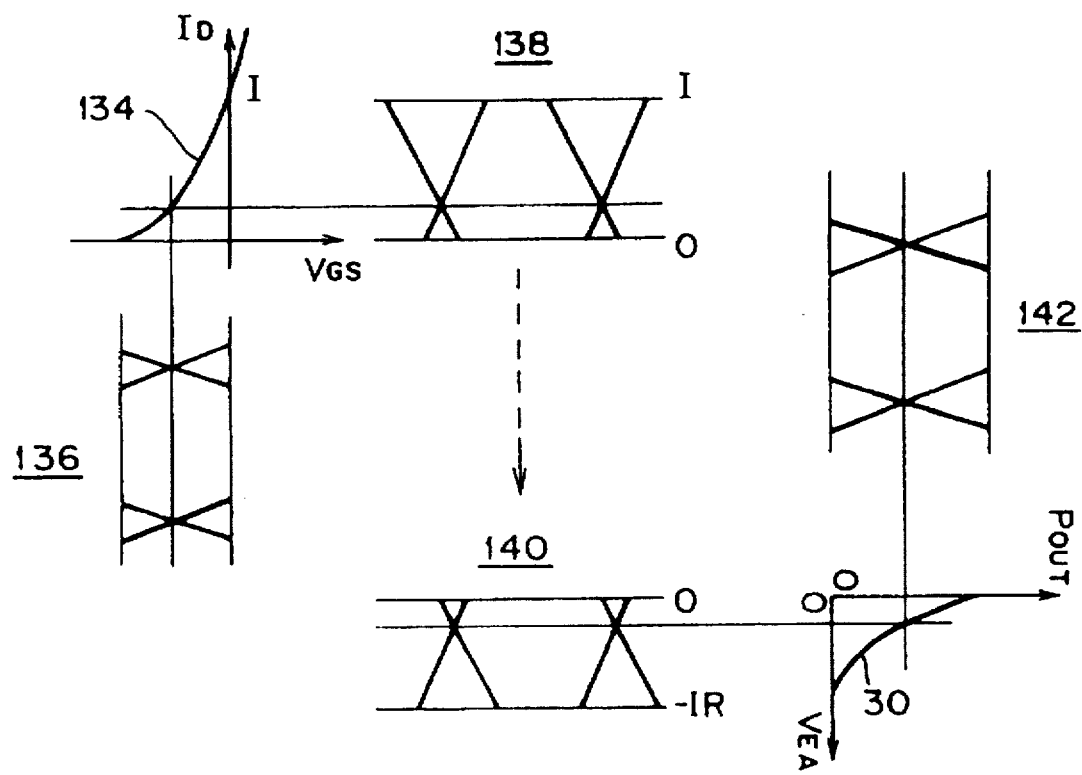
FIG. 19 is a diagram for illustrating the operation principle in FIG. 18.

FIG. 19 is a diagram for illustrating the operation principle of the modulation signal generating circuit shown in FIG. 18. Reference numeral 134 denotes a characteristic curve showing the relation between a drain current ID and a gate/source voltage $V_{GS}$ of the FET 128. In an FET, it is known that a change in drain current is substantially proportional to the square of a change in gate/source voltage.

Assuming that the duty of the digital input signal supplied from the port 130 to the gate of the FET 128 is 100% as shown by reference numeral 136, the duty in an output current waveform of the FET 128 becomes less than 100% as shown by reference numeral 138. Let I denote the current flowing from the anode of the EA modulator 4 into the drain of the FET 128. In this case, the amperage in the output current waveform changes between O and I, and accordingly the applied voltage to the EA modulator 4 changes between O and -IR, where R represents the resistance of the terminating resistor 26. Accordingly, the output voltage waveform of the FET 128 is shown by reference numeral 140, which indicates that the duty is greater than 100%. A change in output voltage of the FET 128 means a modulation signal supplied to the EA modulator 4. Accordingly, the output waveform of the signal light obtained is shown by reference numeral 142 in accordance with the characteristic curve 30 of the EA modulator 4. It is apparent from the output waveform 142 that the duty is returned to almost 100%.

While only the modulation signal generating circuit is shown in FIG. 18, a bias circuit for applying an offset voltage to the EA modulator 4 may be added as similar to the previous preferred embodiments.

Thus, in accordance with another aspect of the present invention, there is provided a drive circuit for an electro-absorption optical modulator for receiving a carrier light from a light source and absorbing the carrier light according to an applied voltage to thereby output an intensity-modulated signal light, comprising a terminating resistor connected to the optical modulator, for generating the applied voltage by a voltage drop in the terminating resistor; and a source grounding circuit having a field effect transistor having a gate supplied with a digital input signal and a drain operatively connected to the optical modulator and the terminating resistor; wherein a characteristic showing a relation between a drain current and a gate/source voltage in the field effect transistor is substantially opposite to a characteristic showing a relation between an optical output and an applied voltage in the optical modulator.

Figure 20:
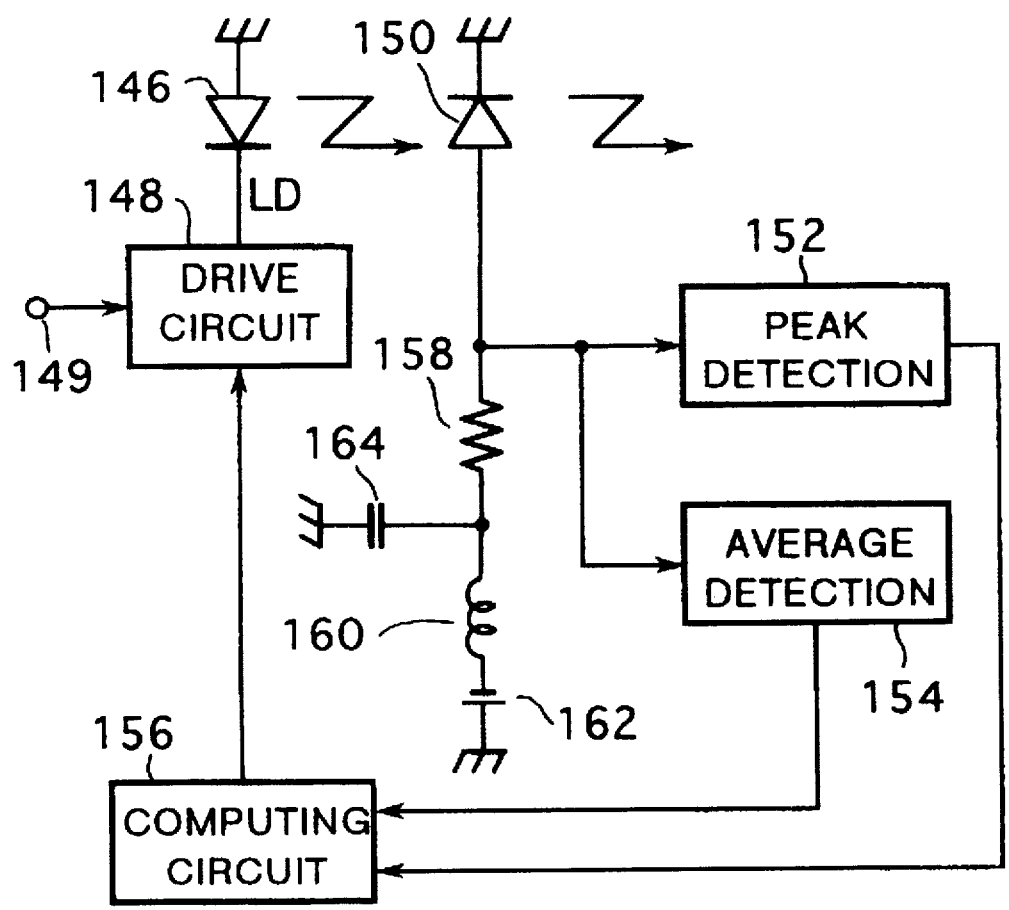
FIG. 20 is a block diagram of an optical transmitter to which direct modulation is applied.

FIG. 20 is a block diagram of an optical transmitter to which direct modulation is applied.

A drive circuit 148 supplies to a laser diode 146 as a light source a drive current obtained by superimposing a modulation signal on a bias voltage. The modulation signal is generated according to an input signal supplied from a port 149 to the drive circuit 148. An intensity-modulated signal light output from the laser diode 146 is passed through an electro-absorption optical element (e.g., EA modulator) 150 and is then fed to an optical transmission line not shown.

A peak detecting circuit 152 and an average detecting circuit 154 are provided to respectively detect the peak and the average of a current generated in the electro-absorption optical element 150 by the absorption of the signal light. A computing circuit 156 performs computation according to the peak and the average detected above, and feeds back the result of the computation to the drive current in the laser diode 146 so that the waveform of the signal light becomes stable. The anode of the electro-absorption optical element 150 is connected to one terminal of a resistor 158. The other terminal of the resistor 158 is connected through an inductor 160 to the negative terminal of a constant voltage source 162. The positive terminal of the constant voltage source 162 is grounded. A capacitor 164 is provided between the ground and a connection point between the resistor 158 and the inductor 160. A change in potential of the anode of the electro-absorption optical element 150 is supplied to the peak detecting circuit 152 and the average detecting circuit 154.

Preferably, the computation performed in the computing circuit 156 includes obtaining a difference between the value twice the average detected by the average detecting circuit 154 and the peak detected by the peak detecting circuit 152. With this configuration, the vertical symmetry and the extinction ratio of the optical output waveform can be maintained to be constant, and the amplitude of the optical output waveform can be controlled to be constant. The details of the operation principle in the optical transmitter shown in FIG. 20 will be easily understood according to the operation principle of an optical output waveform stabilizing circuit well known in Japanese Patent Laid-open No. 6-164049; so, the description thereof will be omitted herein.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An optical transmitter comprising:

a light source supplied with a drive current to generate a carrier light having an intensity corresponding to said drive current;

an electro-absorption optical modulator for receiving said carrier light and absorbing said carrier light according to an applied voltage to thereby output an intensity-modulated signal light;

bias means for applying an offset voltage to said optical modulator;

modulation signal generating means for receiving an input signal to superimpose a modulation signal corresponding to said input signal on said offset voltage;

wherein said light source includes a laser diode having a front surface and a back surface; and said carrier light comprises a forward light emitted from said front surface and a backward light emitted from said back surface;

said optical transmitter further comprising:

a photodector for receiving said backward light to output an electric signal having a level corresponding to the intensity of said backward light; and means for controlling said drive current so that the level of said electric signal becomes constant.

2. An optical transmitter comprising:

a light source supplied with a drive current to generate a carrier light having an intensity corresponding to said drive current;

an electro-absorption optical modulator for receiving said carrier light and absorbing said carrier light according to an applied voltage to thereby output an intensity-modulated signal light;

bias means for applying an offset voltage to said optical modulator;

modulation signal generating means for receiving an input signal to superimpose a modulation signal corresponding to said input signal on said offset voltage;

said bias means includes a variable current source operatively connected to said optical modulator;

said input signal comprises a first signal and a second signal as an inversion signal of said first signal; and said modulation signal generating means includes a differential pair of switching elements having first and second ports supplied with said first and second signals, respectively, and having an output port operatively connected to said optical modulator, and a constant current source operatively connected to said differential pair.

3. An optical transmitter comprising:

a light source supplied with a drive current to generate a carrier light having an intensity corresponding to said drive current;

an electro-absorption optical modulator for receiving said carrier light and absorbing said carrier light according to an applied voltage to thereby output an intensity-modulated signal light;

bias means for applying an offset voltage to said optical modulator;

modulation signal generating means for receiving an input signal to superimpose a modulation signal corresponding to said input signal on said offset voltage;

wherein said bias means includes:

means for detecting an average of a current generated in said optical modulator by absorption of said carrier light; and means for controlling said offset voltage so that said average detected becomes constant.

4. An optical transmitter comprising:

a laser diode having first and second terminals for supply of a drive current, for generating a carrier light having an intensity corresponding to said drive current;

an electro-absorption optical modulator comprising a semiconductor chip monolithically integrated with said laser diode and having third and fourth terminals, for absorbing said carrier light according to an applied voltage supplied between said third and fourth terminals to thereby output an intensity-modulated signal light;

first and second individual leads connected to said first and third terminals, respectively;

a common lead connected to said second and fourth terminals; and a capacitor connected between said first and second terminals.

5. An optical transmitter comprising:

a laser diode having first and second terminals for supply of a drive current, for generating a carrier light having an intensity corresponding to said drive current;

an electro-absorption optical modulator comprising a semiconductor chip monolithically integrated with said laser diode and having third and fourth terminals, for absorbing said carrier light according to an applied voltage supplied between said third and fourth terminals to thereby output an intensity-modulated signal light;

first and second individual leads connected to said first and third terminals, respectively;

a common lead for connecting said second and fourth terminals to a ground; and a resistor and a capacitor connected in series and provided between said first individual lead and said ground.

6. An optical transmitter comprising:

a light source supplied with a drive current to generate a carrier light having an intensity corresponding to said drive current;

an electro-absorption optical modulator for receiving said carrier light and absorbing said carrier light according to an applied voltage to thereby output an intensity-modulated signal light;

bias means for applying an offset voltage to said optical modulator;

modulation signal generating means for receiving an input signal to superimpose a modulation signal corresponding to said input signal on said offset voltage;

means for detecting an average of a current generated in said optical modulator by absorption of said carrier light; and means for controlling said drive current so that said average detected becomes constant.

7. A drive circuit for an electro-absorption optical modulator for receiving a carrier light from a light source and absorbing said carrier light according to an applied voltage to thereby output an intensity-modulated signal light, comprising:

means having first and second input ports supplied with a digital input signal and a reference signal, respectively, for generating a duty-converted input signal obtained by changing a duty of said digital input signal according to said reference signal;

modulation signal generating means for generating a modulation signal according to said duty-converted input signal, applying said modulation signal as a change in said applied voltage to said optical modulator, and outputting an inversion signal of said modulation signal;

average detecting means for receiving said inversion signal, detecting an average of said inversion signal, and outputting said average detected; and means operatively connected to said average detecting means and said second input port, for controlling said reference signal so that said average detected becomes a constant value.

8. A drive circuit according to claim 7, wherein said constant value is set so that a duty of said signal light comes into coincidence with the duty of said digital input signal.

9. A drive circuit for an electro-absorption optical modulator for receiving a carrier light from a light source and absorbing said carrier light according to an applied voltage to thereby output an intensity-modulated signal light, comprising:

means having first and second input ports supplied with a digital input signal and a reference signal, respectively, for generating a duty-converted input signal obtained by changing a duty of said digital input signal according to said reference signal;

modulation signal generating means for generating a modulation signal according to said duty-converted input signal and applying said modulation signal as a change in said applied voltage to said optical modulator;

average detecting means for detecting an average of a current generated in said optical modulator by absorption of said carrier light; and means operatively connected to said average detecting means and said second input port, for controlling said reference signal so that said average becomes a constant value.

10. A drive circuit according to claim 9, wherein said constant value is set so that a duty of said signal light comes into coincidence with the duty of said digital input signal.

11. A drive circuit for an electro-absorption optical modulator for receiving a carrier light from a light source and absorbing said carrier light according to an applied voltage to thereby output an intensity-modulated signal light, comprising:

a terminating resistor connected to said optical modulator, for generating said applied voltage by a voltage drop in said terminating resistor; and a source grounding circuit having a field effect transistor having a gate supplied with a digital input signal and a drain operatively connected to said optical modulator and said terminating resistor;

wherein a characteristic showing a relation between a drain current and a gate/source voltage in said field effect transistor is substantially opposite to a characteristic showing a relation between an optical output and an applied voltage in said optical modulator.

12. An optical transmitter comprising:

a light source;

means for supplying a drive current to said light source so that an intensity-modulated signal light is output from said light source;

an electro-absorption optical element through which said signal light is passed;

peak detecting means and average detecting means for detecting a peak and an average of a current generated in said electro-absorption optical element by absorption of said signal light, respectively; and means for performing computation according to said peak and said average detected, and feeding back a result of said computation to said drive current so that a waveform of said signal light becomes stable.

13. An optical transmitter according to claim 12, wherein said computation includes obtaining a difference between a value twice said average and said peak.

* * * * *